United States Patent
Emoto et al.

(10) Patent No.: US 9,028,719 B2
(45) Date of Patent: May 12, 2015

(54) β- SIALON, AND LIGHT EMITTING DEVICE AND APPLICATIONS THEREOF (75) Inventors: Hideyuki Emoto, Tokyo (JP); Toshiaki Nagumo, Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 113 days.

(21) Appl. No.: 13/811,900

(22) PCT Filed: Apr. 21, 2011

(86) PCT No.: PCT/JP2011/059781
§ 371 (c)(1),
(2), (4) Date: Jan. 23, 2013

(87) PCT Pub. No.: WO2012/077368
PCT Pub. Date: Jun. 14, 2012

(65) Prior Publication Data
US 2013/0120691 A1    May 16, 2013

(30) Foreign Application Priority Data
Dec. 10, 2010    (JP) ................................. 2010-275625

(51) Int. Cl.
  C09K 11/64    (2006.01)
  C09K 11/77    (2006.01)
  H05B 33/14    (2006.01)
  G02F 1/1335    (2006.01)
  C09K 11/08    (2006.01)
  H01L 33/50    (2010.01)

(52) U.S. Cl.
  CPC ......... C09K 11/7729 (2013.01); C09K 11/7734 (2013.01); H05B 33/14 (2013.01); G02F 1/133603 (2013.01); C09K 11/0883 (2013.01); Y02B 20/181 (2013.01); H01L 33/502 (2013.01)

(58) Field of Classification Search
  USPC ....................................... 252/301.4 F; 347/71
  See application file for complete search history.

(56) References Cited

U.S. PATENT DOCUMENTS

| 8,487,393 | B2 * | 7/2013 | Emoto et al. .................. | 257/432 |
| 2007/0108896 | A1 | 5/2007 | Hirosaki ....................... | 313/506 |

FOREIGN PATENT DOCUMENTS

| EP | 2 093 272 A1 | 8/2009 |
| EP | 2 664 660 A1 | 11/2013 |
| JP | 2004-295187 | 10/2004 |
| JP | 2006-344409 | 12/2006 |
| JP | 3921545 | 3/2007 |
| JP | 2008-204874 | 9/2008 |
| JP | 2010-129202 | 6/2010 |
| JP | 2010-251441 | 11/2010 |
| WO | WO 2008/062781 A1 | 5/2008 |
| WO | WO 2010/143590 | * 12/2010 |

OTHER PUBLICATIONS

International Search Report dated May 31, 2011, issued in corresponding International Application No. PCT/JP2011/05978.
Hirosaki Naoto et al, "Characterization and properties of green-emitting[beta]-SiAlON:Eu2+ powder phosphors for white light-emitting diodes", Applied Physics Letters, American Institute of Physics, US, vol. 86, No. 21, May 17, 2005, pp. 211905-211905, XP012065627 Notice of Reasons for Rejection issued to JP Application No. 2003-54665, mailed Nov. 11, 2008.
The extended European search report issued to EP Application No. 11847735.5, mailed Sep. 22, 2014.

* cited by examiner

*Primary Examiner* — Carol M Koslow
(74) *Attorney, Agent, or Firm* — Stein IP, LLC (57) ABSTRACT

An object of the present invention is to provide a phosphor that is combined with a blue LED to achieve white light at a low color temperature as if singly, has a broad fluorescence spectrum for excellent color rendering properties, has a high luminous efficiency, is thermally and chemically stable like conventional nitride-based phosphors, and has a small decrease in luminance at high temperatures. Another object of the present invention is to provide a light emitting device using such a phosphor. The present invention relates to a β-sialon that is expressed by the general formula, $Si_{6-z}Al_zO_zN_{8-z}$:Eu ($0<z<4.2$). In the β-sialon, P2/P1 is not lower than 0.5 and not higher than 1000 (P1 representing the height of an absorption line appearing in the region where g is $2.00\pm0.02$ in a first derivative spectrum obtained by an electron spin resonance technique at 25° C., P2 representing the difference between the maximum value and the minimum value in a spectrum on the lower magnetic field side of P1).

16 Claims, 5 Drawing Sheets

β-SIALON, AND LIGHT EMITTING DEVICE AND APPLICATIONS THEREOF

CROSS-REFERENCE TO RELATED APPLICATIONS

This application is a national stage application of PCT Application No. PCT/JP2011/059781, filed Apr. 21, 2011, which claims benefit of Japanese Application No. 2010-275625, filed Dec. 10, 2010, in the Japanese Intellectual Property Office, the disclosures of which are incorporated herein by reference.

BACKGROUND OF THE INVENTION

1. Field of the Invention

The present invention relates to a β-sialon to be used as a phosphor that can be used in a light emitting device including a blue light-emitting diode or an ultraviolet light-emitting diode, and to a light emitting device and applications thereof.

2. Description of the Related Art

Patent Document 1 discloses an Eu-containing β-sialon that can be used as a phosphor for a white LED and the like and as a green-yellow light emitting component in a light emitting device. A β-sialon is a phosphor containing $Eu^{2+}$ in its crystalline structure, and the $Eu^{2+}$ is excited by ultraviolet-blue light. This phosphor emits green-yellow light, having a peak wavelength of 520 to 560 nm. Patent Document 2 discloses a technique for improving the luminous efficiency of an Eu-containing β-sialon.

Patent Document 1: Japanese Patent Publication No. 3,921,545.
Patent Document 2: International Publication No. WO2008/062781.

SUMMARY OF THE INVENTION

An object of the present invention is to provide a β-sialon having a higher peak intensity in fluorescence measurement. Another object of the present invention is to provide a tight emitting device, an image display apparatus, and an illuminating apparatus that use a β-sialon having a higher peak intensity in fluorescence measurement so as to emit brighter light.

The present invention is a β-sialon expressed by the general formula, $Si_{6-z}Al_zO_zN_{8-z}$:Eu (0<z<4.2), with P2/P1 being not lower than 0.5 and not higher than 1000 (P1 representing the height of an absorption line appearing in the region where g is 2.00±0.02 in a first derivative spectrum obtained by an electron spin resonance technique at 25° C., P2 representing the difference between the maximum value and the minimum value in a spectrum on the lower magnetic field side of P1).

P2/P1 is preferably not lower than 1.9 and not higher than 1000.

Both the maximum value and the minimum value in the spectrum on the lower magnetic field side of the β-sialon preferably appear in the region where g is not smaller than 3.5 and not greater than 6.0.

The spin density corresponding to an absorption line appearing in the region where g is 2.00±0.02 in the electron spin resonance spectrum of the β-sialon at 25° C. is preferably $6 \cdot 10^{16}$ spins/g or lower.

The Eu content of the β-sialon is preferably not smaller than 0.1% by mass and not larger than 3% by mass.

The β-sialon phosphor, when excited by blue light having a wavelength of 450 nm, has a peak wavelength preferably not shorter than 520 nm and not longer than 560 nm, and a half-value width of a fluorescence spectrum thereof is preferably not smaller than 45 nm and not greater than 70 nm.

Another aspect of the invention is a light emitting device that includes: a light emitting source; and a wavelength converting member mounted on the light emitting face of the light emitting source, the above described β-sialon being provided in the wavelength converting member.

Yet another aspect of the invention is an image display apparatus that includes: a liquid crystal panel; and a backlight for the liquid crystal panel, the backlight including the above light emitting device.

Still another aspect of the invention is a lighting apparatus that includes the above light emitting device.

A β-sialon according to the present invention has a higher peak intensity in fluorescence measurement. Since the β-sialon has a higher peak intensity in fluorescence measurement, a light emitting device, an image display apparatus, and a lighting apparatus emit brighter light, using the β-sialon.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

The present invention is a β-sialon that is expressed by the general formula, $Si_{6-z}Al_zO_zN_{8-z}$:Eu (0<z<4.2), with P2/P1 being not lower than 0.5 and not higher than 1000 (P1 representing the height of an absorption line appearing in the region where g is 2.00±0.02 in a first derivative spectrum obtained by an electron spin resonance technique at 25° C., P2 representing the difference between the maximum value and the minimum value in a spectrum on the lower magnetic field side of P1).

P1 in the present invention represents the height of an absorption line that appears in the region where g is 2.00±0.02 in a first derivative spectrum obtained by an electron spin resonance technique (hereinafter referred to as an ESR technique) at 25° C., and is specifically shown as P1 in FIG. 4. P2 in the present invention represents the difference between the maximum value and the minimum value in a spectrum on the lower magnetic field side of P1, and is specifically shown as P2 in FIG. 4.

The β-sialon is identified by P2/P1 in the present invention, based on the following findings. If P2/P1 is too low, crystal defects existing in the β-sialon absorb visible light not causing emission of light, and the $Eu^{2+}$ amount involved in fluorescence emission tends to become smaller, resulting in a lower fluorescence emission efficiency. If P2/P1 is too high, the solid solubility of $Eu^{2+}$ into the β-sialon and the decrease of crystal defects in the β-sialon are restricted. Specifically, P2/P1 is not lower than 0.5 and not higher than 1000, or more preferably, not lower than 1.9 and not higher than 1000.

An ESR technique is a spectrometric analysis to observe transitions that occur between levels when unpaired electrons are located in a magnetic field. Specifically, the energy level of unpaired electrons is split by a Zeeman effect in a magnetic field, and the unpaired electrons absorb the electromagnetic waves of the energy equivalent to the split width of the energy levels. Information about the number of existing unpaired electrons (the number of spins), the states of those unpaired electrons and the like is obtained from the absorption intensity of the absorption spectrum obtained by an ESR technique, and from the intensity of the magnetic field and the frequency of the electromagnetic waves at the time of absorption.

The g value used in the ESR technique is one of the parameters according to ESR techniques, and is obtained by assigning the frequency (v) of the electromagnetic waves and the resonant magnetic field (H) to a resonance condition equation (hv=gβH). Here, h represents the Planck's constant ($6.626 \times 10^{-34}$ J·s), and β represents Bohr magnetons ($9.274 \times 10^{-24}$ J·T$^{-1}$). In the case of free electrons, the g value having a relativistic correction made thereto is 2.0023. Actual unpaired electrons are subject to spin orbit interactions, and therefore, have a specific g value.

Both the maximum value and the minimum value in a spectrum on the lower magnetic field side of the β-sialon preferably appear in the region where g is not smaller than 3.5 and not greater than 6.0, so as to obtain an excellent fluorescence emission efficiency. This range is preferred, because the fluorescence emission efficiency is dramatically improved by achieving a proper ratio between the absorption line intensity in the vicinity of the point of g=2 based on the crystal defects in the β-sialon in the ESR spectrum of the Eu-containing β-sialon, and the absorption line intensity in the vicinity of the point of g=5 based on $Eu^{2+}$, which is solid-solved in the β-sialon and contributes to fluorescence emission.

β-sialon of the present invention is manufactured in the following manner. Raw materials are mixed at a high temperature to generate a β-sialon, and the β-sialon is subjected to a heat treatment process. The heat treatment process may be performed in a vacuum or an inert atmosphere in which the partial pressure of nitrogen is low, so that unpaired electrons that exist in the vicinity of the point where g is 2 and are measured by an ESR spectrum technique can be reduced. Further, the heat treatment atmosphere may be a reducing atmosphere. Accordingly, the effect to reduce the amount of unpaired electrons in the vicinity of the point where g is 2 can be made larger, and the spectrum intensity in the vicinity of the point where g is 5 can be made higher.

The in density corresponding to an absorption line appearing in the region where g is 2.00±0.02 in the electron spin resonance spectrum of the β-sialon at 25° C. is preferably 6 $10^{16}$ spins/g or lower. The spin density is the value per unit mass obtained by dividing the number of spins measured by an ESR technique by the sample mass used in the measurement, and the number of spins in the vicinity of the point where g is 2 is closely related to crystal defects. This is because, when the spin density becomes higher, the amount of exiting unpaired electrons that cause a decrease in luminous efficiency tends to becomes larger, and therefore, the β-sialon host crystals tend to absorb light that does not cause light emission.

The Eu content of the β-sialon is preferably not smaller than 0.1% by mass and not larger than 3% by mass, so that P2/P1 of the ESR spectrum easily falls within the range mentioned above.

The β-sialon of the present invention is used in a light emitting device that includes a light emitting source and a phosphor. The β-sialon of the present invention has light emission characteristics such that emission lines appear in the wavelength region of 520 to 560 nm particularly when ultraviolet light or visible light having a wavelength of 350 to 500 nm is used as the excitation source for irradiation. Accordingly, where a ultraviolet LED or a blue LED is appropriately combined with a phosphor that emits orange-red light and/or a phosphor that emits blue light as needed, white light is generated.

The β-sialon phosphor, when excited by blue light having a wavelength of 450 nm, has a peak wavelength preferably not shorter than 520 nm and not longer than 560 nm, and a half-value width of the fluorescence spectrum thereof is preferably not smaller than 45 nm and not greater than 70 nm.

From the viewpoint of fluorescence emission, the β-sialon may be a mixture containing a certain amount of noncrystalline phase or some other crystalline phase as long as the characteristics are not degraded. However, the β-sialon preferably contains the largest possible amount of β-sialon crystalline phase with a high purity, and is preferably formed with a single phase.

If the mean particle size of the β-sialon is too small, the light absorptance tends to become lower due to particle dispersion, and uniform dispersion in the resin sealing the LED tends to become difficult. If the mean particle size is too large, the intensity of emission and the color tone tend to vary. Therefore, the mean particle size is preferably not smaller than 1 μm and not larger than 30 μm.

Another aspect of the invention is a light emitting device that includes a light emitting source and a wavelength converting member mounted on the light emitting face of the light emitting source, with the above described β-sialon being provided in the wavelength converting member.

The light emitting device of the present invention includes at least one light emitting source and a phosphor including the β-sialon of the present invention. The light emitting source is preferably an LED or a fluorescent lamp. This light emitting device has light emission characteristics such that emission lines appear in the wavelength region of 520 to 560 nm when ultraviolet light or visible light is used as the excitation source, for example. Accordingly, this light emitting device can generate white light by appropriately combining a ultraviolet LED or a blue LED with a phosphor that emits orange-red light and/or a phosphor that emits blue light, as needed.

The emission wavelength of ultraviolet light is normally 350 to 500 nm, and the emission wavelength of blue light is normally 440 to 480 nm.

In the light emitting device, the above described β-sialon may be used independently as a phosphor, or may be used together with a phosphor that has different light emission characteristics. The β-sialon of the present invention may also be combined with a nitride or oxynitride phosphor having a small decrease in luminance at high temperatures, such as an Eu-containing α-sialon orange phosphor or a $CaAlSiN_3$:Eu red phosphor. In this manner, color rendering properties and color reproducibility are improved.

Yet another aspect of the invention is an image display apparatus that includes a liquid crystal panel and a backlight for the liquid crystal panel, with the backlight including the above described light emitting device. Using the above described light emitting device, this image display apparatus serves as a liquid crystal display apparatus with preferred color reproducibility.

Still another aspect of the invention is a lighting apparatus that includes the above described light emitting device. Using the above described light emitting device, this lighting apparatus serves as any kind of indoor lighting with preferred color rendering properties.

Referring now to the drawings and tables, examples of β-sialons according to the present invention are described in detail in conjunction with comparative examples.

A β-sialon according to Example 1 is expressed by the general formula, $Si_{6-z}Al_zO_zN_{8-z}$ (z=0.2), and contains Eu as the light emission center, with P2/P1 being 3.4, P1 representing the height of an absorption line appearing in the region where g is 2.00±0.02 in a first derivative spectrum obtained by an electron spin resonance technique at 25° C., P2 representing the difference between the maximum value and the minimum value in a spectrum on the lower magnetic field side of P1.

Figure 4:
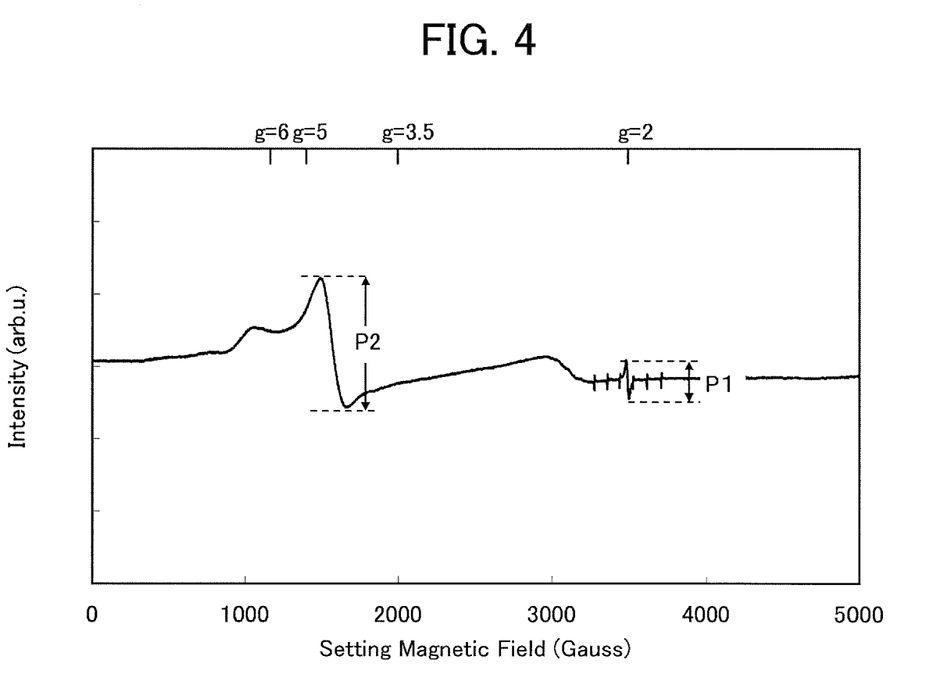
FIG. 4 shows the ESR spectrum of a β-sialon of Example 1.
Figure 5:
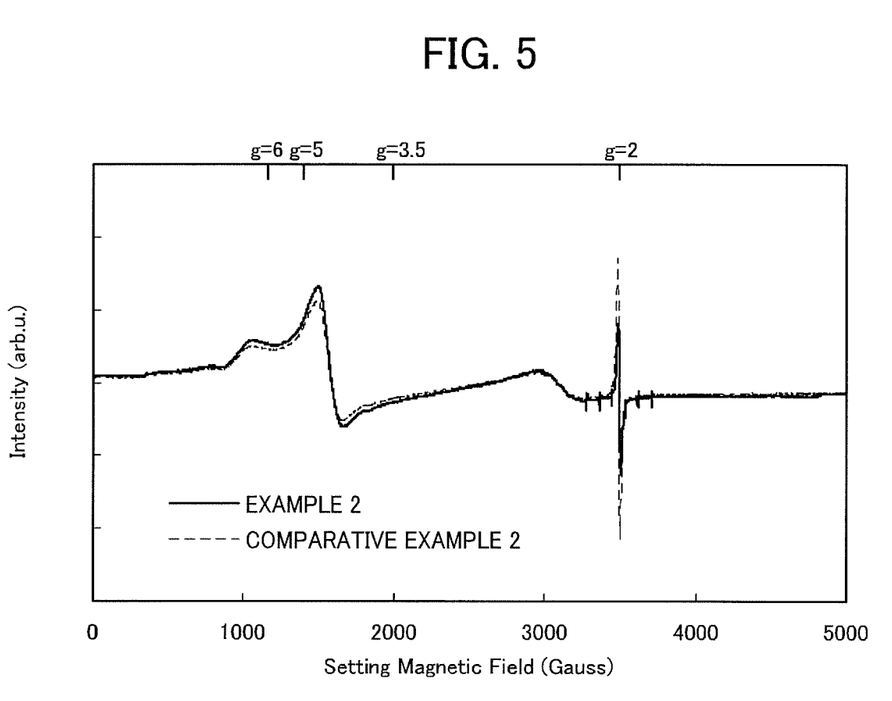
FIG. 5 shows the ESR spectra of β-sialons of Example 2 and Comparative Example 1.

FIG. 4 shows ESR spectrum of the β-sialon of Example 1. P2/P1 (in the expression, P1 represents the height of an absorption line appearing in the region where g is 2.00±0.02 in a first derivative spectrum obtained by an electron spin resonance technique at 25° C., and P2 represents the difference between the maximum value and the minimum value in a spectrum on the lower magnetic field side of P1) was 3.4. The g values ($g_{max}$ and $g_{min}$) at which the maximum value and the minimum value of the spectrum on the lower magnetic field side appeared were 4.7 and 4.2, respectively. The spin density that corresponded to the absorption in the region where g was 2.00±0.02 and was quantitated with the use of a standard sample was 9.1 $10^{15}$ spins/g.

When powder X-ray diffraction measurement (XRD) using a Kα-line of Cu was carried out on the β-sialon of Example 1, the only existing crystalline phase was the β-sialon. The Eu content determined by an ICP emission spectrometric analysis was 0.48% by mass.

Method of Manufacturing the β-Sialon

A method of manufacturing the β-sialon includes a calcination process for calcining mixed starting materials, a heat treatment process to be performed after the calcined materials are turned into powder, and an acid treatment process for removing impurities from the heat-treated powder.

(Calcination Process)

An α-silicon nitride powder (manufactured by Ube Industries, Ltd., Grade SN-E10), a nitride aluminum powder (manufactured by Tokuyama Corporation, Grade E), and an aluminum oxide powder (manufactured by Taimei Chemicals Co., Ltd., Grade TM-DAR) were combined, so that the z value of the Eu-containing β-sialon ($Si_{6-z}Al_zO_zN_{8-z}$:Eu) after the synthesis became 0.2. Further, 0.8% in outer percentage by mass of an europium oxide powder (manufactured by Shin-Etsu Chemicals Co, Ltd., Grade Ru) was combined with those powders, to obtain a raw material mixture.

Using a nylon pot and silicon nitride balls, dry ball mill mixing was performed on the raw material mixture. After that, the mixture was put through a sieve with a sieve aperture of 150 μm, to remove aggregation substance and obtain a raw material powder.

A cylindrical container made of boron nitride with a lid (manufactured by Denki Kagaku Kogyo Kabushiki Kaisha, Grade N-1) was filled with the raw material powder, and a 10-hour calcination was performed at 2000° C. in a 0.8 MPa pressurized nitrogen atmosphere in an electric furnace having a carbon heater, to obtain a product material of the β-sialon. After lightly cracked, the product material was put through a sieve with a sieve aperture of 45 μm, to obtain a product powder of the β-sialon.

(Heat Treatment Process)

A cylindrical container made of boron nitride was filled with the product powder, and a 6-hour heat treatment was performed at 1500° C. in a hydrogen-flow atmosphere at atmospheric pressure in an electric furnace having a tungsten heater in which the furnace is entirely made of metals. As a result, a heat-treated powder of the β-sialon was obtained. The metals in the furnace in this example are tungsten and molybdenum forming furnace components.

(Acid Treatment Process)

The heat-treated powder of the β-sialon was then immersed in a mixed acid of hydrofluoric acid and nitric acid. After that, decantation to remove the supernatant and fine powder was repeated until the liquid solution became neutral. The resultant precipitate was filtered and dried, and was further put through a sieve with a sieve aperture of 45 μm, to obtain the β-sialon of Example 1.

Next, 50 mg of the obtained β-sialon was put into an ESR sample tube, and ESR measurement was carried out at room temperature. In the measurement, a "JES-FE2XG ESR measurement apparatus", manufactured by JEOL Ltd., was used.

(P2/P1)

The measurement conditions for determining P2/P1 were as follows:

Magnetic field sweep range: 0 to 5000 gausses (0 to 500 mT)

Magnetic field modulation: 100 kHz, 5 gausses

Radiated electromagnetic waves: 10 mW, 9.2 GHz (subjected to fine adjustment in each measuring operation, so as to achieve a resonant frequency)

(Spin Density)

The measurement conditions for determining the spin density were as follows:

Magnetic field sweep range: 3050 to 3550 gausses (305 to 355 mT)

Magnetic field modulation: 100 kHz, 5 gausses

Radiated electromagnetic waves: 10 mW, 9.2 GHz (subjected to fine adjustment in each measuring operation, so as to achieve a resonant frequency)

(g Value)

The g value of an absorption line was determined from the frequency of the radiated electromagnetic waves and the magnetic field intensity, according to a resonance condition equation. The g value of the absorption line was determined based on the peak position of the above described $Mn^{2+}$ standard sample.

(Spin Density)

FIG. 4 shows the ESR spectrum of the β-sialon of Example 1. Where P1 represented the height of an absorption line appearing in the region where g was 2.00±0.02 while P2 represented the difference between the maximum value and the minimum value in a spectrum on the lower magnetic field side of P1, P2/P1 was 3.4. The g values ($g_{max}$ and $g_{min}$) of the maximum value and the minimum value of the spectrum on the lower magnetic field side were 4.7 and 4.2, respectively. The spin density that corresponded to the absorption in the region where g was 2.00±0.02 and was quantitated with the use of the standard sample was $9.1 \times 10^{15}$ spins/g.

Figure 1:
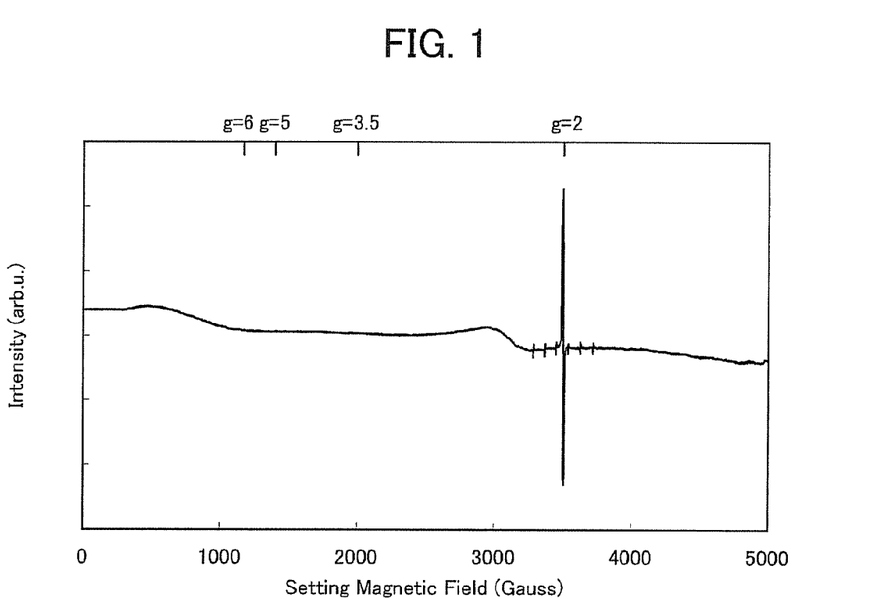
FIG. 1 shows the ESR spectrum of a β-sialon not containing Eu.

For a comparison purpose. FIG. 1 shows the ESR spectrum of a β-sialon not containing Eu. The six small absorption lines in the vicinity of g=2 in the graph were due to the $Mn^{2+}$ contained in the standard sample for quantitating a g value and a spin density. The β-sialon has a large number of crystal defects having unpaired electrons almost in a free electron state, and, as shown in FIG. 1, distinct absorption lines are observed in the vicinity of g=2. There is a close relationship between the absorption line intensity and the visible light absorption by the material. As the absorption lines in the vicinity of g=2 become smaller, the visible light absorption by the material also becomes smaller, and the material becomes more transparent.

Figure 2:
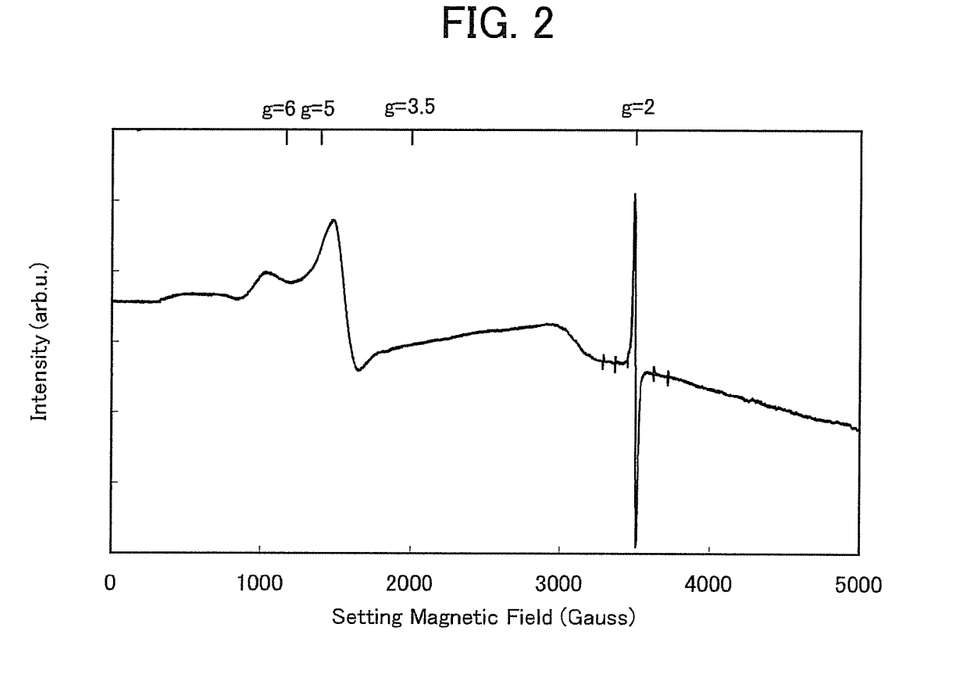
FIG. 2 shows the ESR spectrum of a β-sialon containing Eu.

To develop the function of a phosphor, the $Eu^{2+}$ contained in the β-sialon crystals has unpaired electrons in the 4f orbit, and accordingly, can be quatitated by an ESR technique. The electronic state of $Eu^{2+}$ is affected by its coordination environment, and therefore, the positions of the absorption lines in an ESR spectrum vary with host crystals. FIG. 2 shows the ESR spectrum of a β-sialon containing Eu. Not only the absorption lines in the vicinity of g=2 caused by the crystal defects in the β-sialon shown in FIG. 1, but also absorption lines caused by the unpaired electrons of $Eu^{2+}$ are observed in the vicinity of g=5 with lower magnetic field.

Eu ions exist in the divalent state and the trivalent state. In the case of $Eu^{2+}$, uniform and broad light emission is achieved by virtue of transitions between the 4f orbit and the 5d orbit, and the outermost 5d electrons are greatly affected by adjacent anions. Therefore, fluorescence emission wavelengths vary with host crystals. Light emission from $Eu^{3+}$ is caused by transitions within the 4f-4f orbits. Therefore, the light emission involves intense emission lines. Also, since the transitions are within the 4f-4f orbits shielded by the outermost electrons, the light emission is not easily affected by adjacent anions.

Figure 3:
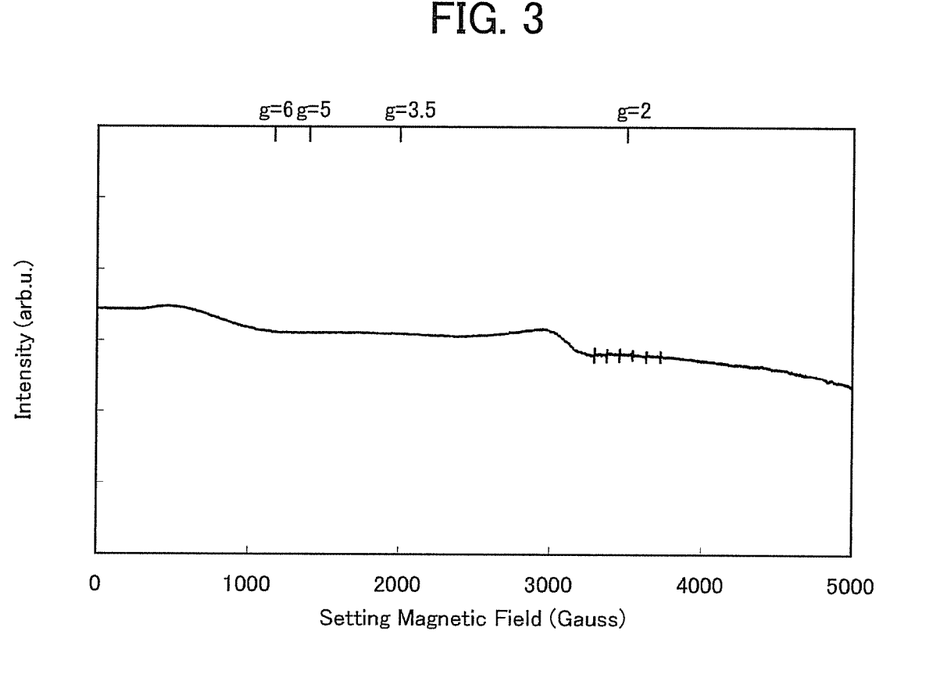
FIG. 3 shows the ESR spectrum of an europium oxide powder.

Unlike $Eu^{2+}$, $Eu^{3+}$ cannot have absorption lines detected by an ESR technique at room temperature. FIG. 3 shows the ESR spectrum of $Eu_2O_3$ containing only $Eu^{3+}$, and no absorption lines were observed.

The fluorescence spectrum of an Eu-containing β-sialon is uniform and broad, and no intense emission lines are observed. Therefore, only $Eu^{2+}$ is involved in light emission. Accordingly, a spectrum in the vicinity of g=5 as measured by an ESR technique indicates information about $Eu^{2+}$ contributing to fluorescence emission.

When powder X-ray diffraction measurement (XRD) using a Kα-line of Cu was carried out on the β-sialon of Example 1, the only existing crystalline phase was the β-sialon. The Eu content determined by an ICP emission spectrometric analysis was 0.48% by mass.

(Fluorescence Measurement)

The fluorescence spectrum was measured by using a spectrophotofluorometer (F7000, manufactured by Hitachi High-Technologies Corporation). The excitation wavelength was 455 nm, which was of blue light, and the peak intensity and peak wavelength of the fluorescence spectrum were determined. Since the peak intensity varies with measurement devices and conditions, comparisons between examples and comparative examples were made based on the values relative to the peak intensity of YAG:Ce (P46-Y3, manufactured by Mitsubishi Chemical Corporation) measured under the same conditions. The peak intensity of the β-sialon of Example 1 was 230%, and the peak wavelength was 540 nm.

The evaluation results are shown in Table 1.

TABLE 1

| | Heat treatment atmosphere | Eu content (% by mass) | ESR measurement | | | | Fluorescence measurement | |
| | | | P2/P1 | gmax | gmin | g = 2 spin density (spins/g) | Peak intensity (%) | Peak wave length (nm) |
|---|---|---|---|---|---|---|---|---|
| Example 1 | $H_2$ | 0.48 | 3.4 | 4.7 | 4.2 | $9.1 \times 10^{15}$ | 230 | 540 |
| Example 2 | Ar + 5% $H_2$ | 0.51 | 0.91 | 4.7 | 4.2 | $3.2 \times 10^{16}$ | 225 | 540 |
| Comparative Example 1 | Ar | 0.50 | 0.42 | 4.7 | 4.2 | $7.4 \times 10^{16}$ | 200 | 542 |

Example 2

In Example 2, a β-sialon was manufactured in the same manner as in Example 1, except that the atmosphere in the heat treatment process was a gas containing 95% of argon and 5% of hydrogen.

Comparative Example 1

In Comparative Example 1, a β-sialon was manufactured in the same manner as in Example 1, except that the atmosphere in the heat treatment process was an argon gas.

As shown in Table 1, the fluorescence peak intensity was higher where P2/P1 was higher.

Examples 3, 4 and 5

In Examples 3 through 5, β-sialons were manufactured in the same manner as in Example 1, except that the z value of the β-sialon of Example 3 was 0.10, the z value of the β-sialon of Example 4 was 0.40, and the z value of the β-sialon of Example 5 was 1.0. The evaluation results are shown in Table 2.

TABLE 2

| | z value of raw material | Eu content (% by mass) | ESR measurement | | | | fluorescence measurement | |
|---|---|---|---|---|---|---|---|---|
| | | | P2/P1 | gmax | gmin | g = 2 spin density (spins/g) | Peak intensity (%) | Peak wave length (nm) |
| Example 1 | 0.20 | 0.48 | 3.4 | 4.7 | 4.2 | $9.1 \times 10^{15}$ | 230 | 540 |
| Example 3 | 0.10 | 0.32 | 9.8 | 4.7 | 4.3 | $3.1 \times 10^{15}$ | 245 | 535 |
| Example 4 | 0.40 | 0.52 | 35.5 | 4.7 | 4.2 | $1.5 \times 10^{15}$ | 238 | 544 |
| Example 5 | 1.0 | 0.34 | 11.3 | 4.6 | 4.2 | $5.2 \times 10^{15}$ | 215 | 550 |

Improving the fluorescence characteristics by making P2/P1 higher was effective in the range of the z values of the β-sialons of Examples 1 and 3 through 5.

Comparative Example 2

In Comparative Example 2, a β-sialon was manufactured in the same manner as in Example 1, except that the holding temperature in the β-sialon calcination process was 1800° C., and the holding time was four hours. The evaluation results are shown in Table 3.

TABLE 3

| | Calcination temperature × time | Eu content (% by mass) | ESR measurement | | | | Fluorescence measurement | |
|---|---|---|---|---|---|---|---|---|
| | | | P2/P1 | gmax | gmin | g = 2 spin density (spins/g) | Peak intensity (%) | Peak wave length (nm) |
| Example 1 | 2000° C. × 10 h | 0.48 | 3.4 | 4.7 | 4.2 | $9.1 \times 10^{15}$ | 230 | 540 |
| Comparative Example 2 | 1800° C. × 4 h | 0.46 | 0.2 | 4.7 | 4.3 | $1.3 \times 10^{16}$ | 56 | 535 |

Comparative Example 2 is the same as Example 1 in the total Eu content. In Comparative Example 2, however, since the amount of $Eu^{2+}$ solid-solved in the β-sialon crystals was very small, P2 was very low, and the fluorescence intensity was remarkably low.

Example 6 and Comparative Example 3

An example of a light emitting device as another aspect of the invention is now described as Example 6.

The light emitting device of Example 6 is a white LED that was manufactured in the following manner. The phosphor of Example 1 and a red phosphor (the emission peak wavelength: 650 nm) having the composition, $Ca_{0.992}Eu_{0.08}AlSiN_3$, were added to silicone resin. After subjected to defoaming and kneading, the silicone resin was potted in a surface-mount package to which a blue LED element having a peak wavelength of 450 nm was bonded. Thermal curing was further performed, to form the white LED. In a comparative example (Comparative Example 3), a white LED was manufactured using the phosphor of Comparative Example 1.

The light emitting devices of Example 6 and Comparative Example 3 were made to emit light under the same energization conditions, and the center illuminances and chromaticities (CIE1931) under the same conditions were measured with a luminance meter. As a result of a comparison between the center illuminances in white light emitting devices having the chromaticity coordinates (x, y) at (0.31, 0.32), the center illuminance in Example 6 was 8% higher than the center illuminance in Comparative Example 3.

As another example, an image display apparatus using the light emitting device of Example 6 as the backlight for a liquid crystal panel is now described. Since this image display apparatus had a liquid crystal panel using a brighter backlight, images were more brightly displayed.

As yet another example, a lighting apparatus using the light emitting device of Example 6 is now described. This lighting apparatus exhibited a higher illuminance.

Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. A β-sialon expressed by the general formula, $Si_{6-z}Al_zO_zN_{8-z}$:Eu (0<z<4.2), with P2/P1 being not lower than 0.5 and not higher than 1000 (P1 representing a height of an absorption line appearing in a region where g is 2.00±0.02 in a first derivative spectrum obtained by an electron spin resonance technique at 25° C., P2 representing a difference between a maximum value and a minimum value in a spectrum on a lower magnetic field side of P1),
wherein the Eu content of the β-sialon is not smaller than 0.1% by mass and not larger than 3% by mass.

2. The β-sialon according to claim 1, wherein P2/P1 is not lower than 1.9 and not higher than 1000.

3. The β-sialon according to claim 1, wherein both the maximum value and the minimum value in the spectrum on the lower magnetic field side of the β-sialon appear in a region where g is not smaller than 3.5 and not greater than 6.0.

4. The β-sialon according to claim 1, wherein a spin density corresponding to the absorption line appearing in the region where g is 2.00±0.02 in an electron spin resonance spectrum of the β-sialon at 25° C. is $6 \times 10^{16}$ spins/g or lower.

5. The β-sialon according to claim 1, wherein, when excited by blue light having a wavelength of 450 nm, has a peak wavelength not shorter than 520 nm and not longer than 560 nm, and a half-value width of a fluorescence spectrum thereof is not smaller than 45 nm and not greater than 70 nm.

6. A light emitting device comprising:

a light emitting source; and a wavelength converting member mounted on a light emitting face of the light emitting source, wherein the β-sialon according to claim 1 is provided in the wavelength converting member.

7. An image display apparatus comprising:

a liquid crystal panel; and a backlight for the liquid crystal panel, wherein the backlight includes the light emitting device according to claim 6.

8. A lighting apparatus comprising the light emitting device according to claim 6.

9. The β-sialon according to claim 2, wherein a spin density corresponding to the absorption line appearing in the region where g is 2.00±0.02 in an electron spin resonance spectrum of the β-sialon at 25° C. is $6 \times 10^{16}$ spins/g or lower.

10. The β-sialon according to claim 3, wherein a spin density corresponding to the absorption line appearing in the region where g is 2.00±0.02 in an electron spin resonance spectrum of the β-sialon at 25° C. is $6 \times 10^{16}$ spins/g or lower.

11. A light emitting device comprising:

a light emitting source; and a wavelength converting member mounted on a light emitting face of the light emitting source, wherein the β-sialon according to claim 2 is provided in the wavelength converting member.

12. A light emitting device comprising:

a light emitting source; and a wavelength converting member mounted on a light emitting face of the light emitting source, wherein the β-sialon according to claim 3 is provided in the wavelength converting member.

13. A light emitting device comprising:

a light emitting source; and a wavelength converting member mounted on a light emitting face of the light emitting source, wherein the β-sialon according to claim 4 is provided in the wavelength converting member.

14. A light emitting device comprising:

a light emitting source; and a wavelength converting member mounted on a light emitting face of the light emitting source, wherein the β-sialon according to claim 6 is provided in the wavelength converting member.

15. A light emitting device comprising:

a light emitting source; and a wavelength converting member mounted on a light emitting face of the light emitting source, wherein the β-sialon according to claim 10 is provided in the wavelength converting member.

16. A light emitting device comprising:

a light emitting source; and a wavelength converting member mounted on a light emitting face of the light emitting source, wherein the β-sialon according to claim 11 is provided in the wavelength converting member.

\* \* \* \* \*